United States Patent [19]

Houdy et al.

[11] Patent Number: 5,105,066
[45] Date of Patent: Apr. 14, 1992

[54] DEVICE COMPRISING A HEATING SAMPLE CARRIER

[76] Inventors: Philippe Houdy, 62, rue des Vignes, 91510 Lardy; Roger Greco, 39, rue des Mimosas, 77330 Ozoir la Ferrière; Claude Morhaim, 146, rue Raymond Losserand, 75014 Paris; Francois Delarue, 14, Chemin des Lionnes, 94500 Champigny-sur-Marne, all of France

[21] Appl. No.: 462,872

[22] Filed: Dec. 28, 1989

Related U.S. Application Data

[63] Continuation-in-part of Ser. No. 448,022, Dec. 8, 1989, abandoned.

[30] Foreign Application Priority Data

Dec. 30, 1988 [FR] France ............... 88 17496

[51] Int. Cl.$^5$ .................... F27D 11/00; H05B 3/68; H05B 3/06
[52] U.S. Cl. .................... 219/385; 219/458; 219/459; 219/464; 219/532
[58] Field of Search ............... 219/458, 459, 463, 464, 219/465, 466, 543, 385, 429, 432, 435

[56] References Cited

U.S. PATENT DOCUMENTS

| | | | |
|---|---|---|---|
| 1,406,850 | 2/1922 | Hadaway | 392/309 |
| 1,639,382 | 8/1927 | Moffat | 219/521 |
| 2,261,496 | 11/1941 | Happe et al. | 338/318 |
| 2,269,689 | 1/1942 | Reichold | 219/342 |
| 2,456,202 | 12/1948 | Lee | 219/521 |
| 3,047,702 | 7/1962 | Lefebvre | 219/458 |
| 3,789,189 | 1/1974 | Fisher et al. | 219/466 |
| 4,054,939 | 10/1977 | Ammon | 361/414 |
| 4,196,338 | 4/1980 | Edel | 219/543 |
| 4,491,173 | 1/1985 | Demand | 219/218 |

Primary Examiner—Teresa J. Walberg
Assistant Examiner—Tuan Vinh To
Attorney, Agent, or Firm—Norman N. Spain

[57] ABSTRACT

A device that includes a heating sample carrier which has a carrying surface, an electrical heating system and a frame support for receiving a frame. The electrical heating system is formed of a disk of a refractory insulating material.

26 Claims, 6 Drawing Sheets

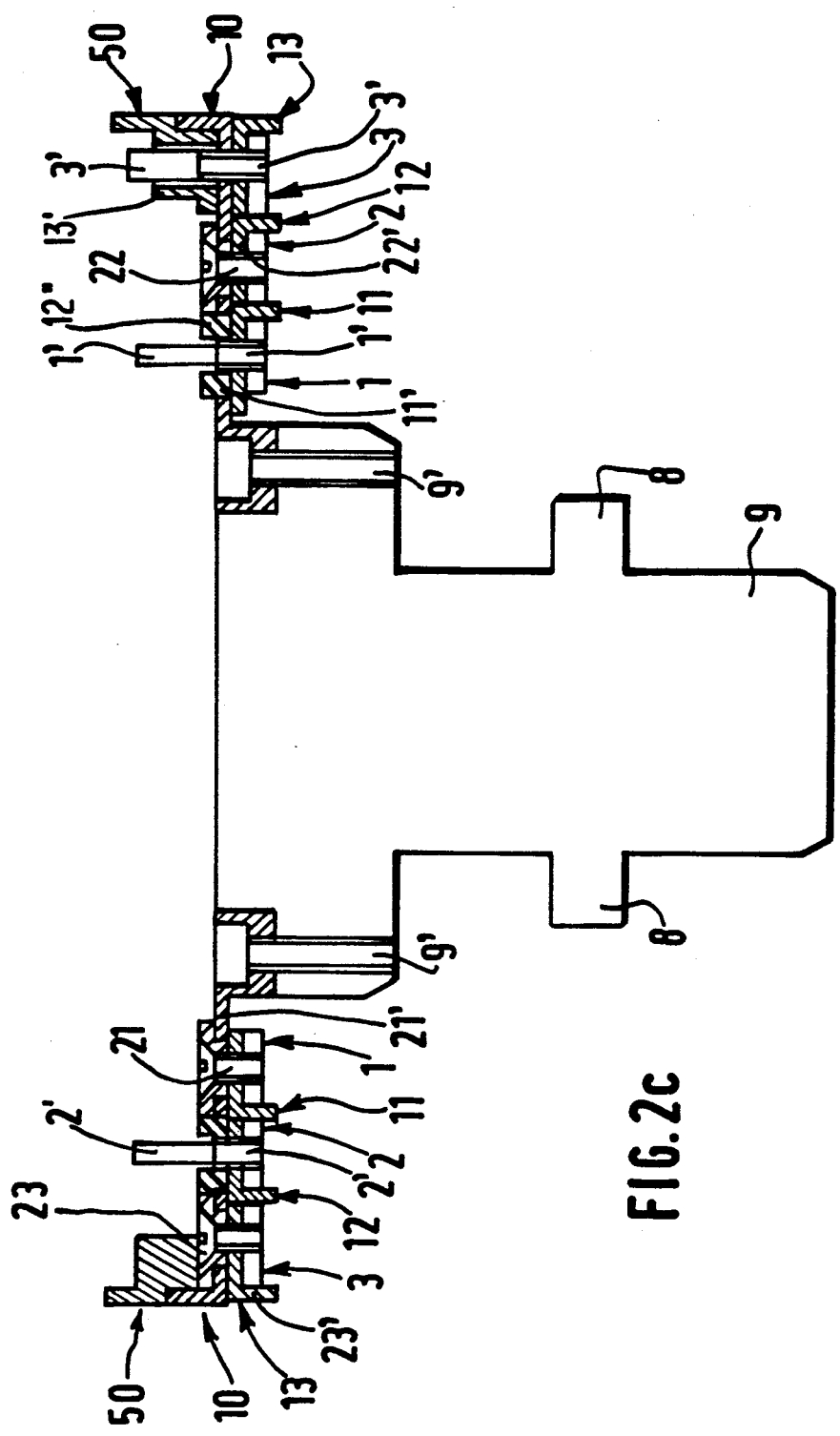

DEVICE COMPRISING A HEATING SAMPLE CARRIER

This is a continuation-in-part of application Ser. No. 07/448,022, filed Dec. 8, 1989 now abandoned.

BACKGROUND OF THE INVENTION

The invention relates to a device including a heating sample carrier, which comprises a carrying surface, an electrical heating system and a frame; and more particularly to such a device which includes a frame support adapted to receive the frame of the sample carrier.

The invention is used in the semiconductor industry to the extent to which, in order to manufacture circuits comprising layers on wafers, it is necessary to subject these layers to annealing treatments during the processing of the circuit, i.e. in situ.

The invention is used particularly in the manufacture of circuits of thin layers of a superconducting material, which manufacture necessitates annealing treatments.

In general, the invention is used in any construction necessitating the heating of a substrate in a closed space and especially in a vacuum or in an aggressive atmosphere.

A device commercially available intended to heat samples in a vacuum chamber is marketed by the French Company "MECA 2000", 37 Rue Saint Le'ger, 78 540 Vernouillet, France. The commercially available device is a 2" heating sample carrier. This known device consists of a standard sample carrier provided with a heating system. The sample carrier is solid. It has the general form of a large nail having a flat head in the form of a disk, the upper surface of this disk constituting the carrying surface of the sample. The heating system consists of a metallic filament arranged in the shape of a meander on the back surface of the disk. It raises the temperature of the sample arranged on the other surface by heating the metal of which the disk is composed. For this purpose, this metal must have a good thermal conductivity.

It is also important to note that the sample carrier is fixed to the framework of the vacuum chamber and cannot be removed in a simple manner. The heating filament is fed electrically by means of a transfer rod. Thus, the sample carrier is connected to the framework by the electrical supply wires of the heating filament. This electrical connection means prevents detaching the sample carrier from the framework, except during a complete disassembly operation, and even then cannot be detached by a simple displacement. However, there is a small latitude of displacement of the sample carrier parallel to the rod, but this results in only a small inclination of the sample with respect to the horizontal line.

The main disadvantage of this sample carrier is therefore that it is permanently fixed to a given vacuum chamber. It is therefore difficult to displace it in the chamber in which it is contained or from one chamber to the other.

For the envisaged use in annealing layers during the processing of integrated circuits or in the manufacture of layers at high temperatures, the known device moreover has a certain number of disadvantages.

In the first place, it is not apt to heat homgeneously samples of large surface area or several juxtaposed samples on the carrying surface leading to a large surface area to be heated. This is due to the mode of application and to the shape of the heating filament, which produces in the sample or samples arranged at the surface of the carrier considerable temperature gradients. In particular during operation, the temperature of the carrying surface is considerably higher at its center than at its periphery.

In the second place, the "image" of the meandering filament appears on the layer which has been subjected to the heat treatment.

In the third place, this device is very fragile. In fact, during the shaping of the meander constituting the filament, constrictions are formed in the metal, which makes the filament liable to break upon heating. This device therefore becomes inoperative after a very short operating time. As it has been found that this device is very complicated, its use therefore is very expensive.

In the fourth place, this sample carrier has a tendency to degased. This degas is caused by the material used to form the filament. Therefore, the user of this device cannot obtain a vacuum higher than $10^{-6}$ in the chamber torn. This limitation is unacceptable for the processing of layers in the integrated circuit technologies, in which most frequently values of $10^{-8}$ torr must absolutely be attained.

In the fifth place, this device can also be subject to damage during certain types of use. It is in fact not rare that in the integrated circuit technologies it is necessary to form metallic or insulating deposits in the vacuum space by a so-called sputtering method using gases, such as;

Ar, O, N, or H in combination with gases such as $Cl_2$ or F, at a low partial pressure, to form a plasma. The use of the known device is excluded in this kind of application because the plasmas formed are corrosive for the heating filament and destroy it.

SUMMARY OF THE INVENTION

According to the invention, these disadvantages are avoided by means of a device provided with the elements described in the preamble, and characterized in that the electrical heating system comprises a disk of a refractory insulating material, whose upper surface is provided with an assembly of electrical resistors, the lower surface of the frame carries conductor tracks insulated from each other and from the frame to form the electrical supply system of the assembly of resistors, the upper surface of the frame support comprises a number of electrical supply pads, at least equal in number to the number of conductor tracks, arranged so that each pad can contact one of the conductor tracks on the frame, and the elements of the heating sample carrier, and especially the frame and the frame support, are not integral with each other but instead these elements fit together.

The sample carrier of the device according to the invention thus provides the essential advantage that it can readily be displaced in the chamber in which it is contained or moved from one chamber to another. Moreover, due to the fact that the electrical heating system comprises a disk of a refractory insulating material, whose upper surface is provided with an assembly of electrical resistors, the device according to the invention then has the advantage that it can very readily be manufactured and that it is not expensive.

As the case may be, the disk provided with the resistors may readily be exchanged.

In a particular embodiment, the device is characterized in that the assembly of the electrical resistors is formed by layers which are resistive for the body of the resistors and are conducting for the ends, respectively. These layers may advantageously be of the tyupe applied by silk-screen printing.

The technology used to manufacture the circuit of heating resistors is particularly flexible in use and a form of design can be found which satisfactorily covers the whole heating surface in a uniform manner. The temperature gradients are then suppressed.

In a further preferred embodiment, the device is characterized in that refractory disk is moreover provided with metallized holes arranged so as to coincide with the ends of the resistors, and in that the lower surface of the refractory disk is moreover provided with a circuit of conducting lines arranged according to a design suitable to connect the assembly of resistors in parallel and in that this circuit is connected to the assembly of resistors by metallization of the holes. These holes and circuit may advantageously be of the type applied by silk-screen printing.

In a further preferred embodiment, the device according to the invention is also characterized in that the material for forming the refractory disk is a glass ceramic.

In this embodiment, the device according to the invention is particularly resistant to the aggression of chemical agents. Moreover, layers applied by silk-screen printing for forming the assembly of heating resistors are capable of supplying very high temperatures. In addition, in this embodiment, the disk does not degas and, if the sample carrier must be used in a vacuum chamber, very high vacuum conditions can be attained.

In yet another preferred embodiment, the device is characterized in that an electrically insulating and refractory disk is arranged in the bottom of the recess of the frame between the refractory disk and the frame.

In this embodiment, very high temperatures can be attained. In fact, this embodiment permits thermally insultating the refractory disk from the frame at these temperatures.

In another preferred embodiment, the device is characterized in that the carrying surface of the sample carrier is constituted by the upper surface of a crown of an insulating and refractory material carried by the upper surface of the frame, the height of this crown being such that this carrying surface is located at a small distance from the surface of the resistors of the refractory disk.

In this embodiment, the small distance thus obtained between the heating surface and the sample permits further minimizing the temperture gradients in the sample.

In yet another embodiment, the device is characterized in that the lower surface of the frame comprises at least two conductor tracks insulated from each other and from the frame to form the electrical supply system of the assembly of resistors. In this embodiment, the electrical connection between the tracks and the circuit of resistors is obtained by means of at least one metallic pin per track traversing the thickness of the frame at the center of an insulating bead, these pins being arranged according to a design suitable to coincide with the metallized holes of the refractory disk and having a diameter suitable to enter these metallized holes while forming the electrical contact required.

In this embodiment, the electrical connection between the disk carrying the resistors and the electrical supply is particularly simple and effective because a simple envelope for the pins carried by the frame in the metallized holes of the refractory disk is concerned.

In a further preferred embodiment, this device is characterized in that the frame carries three conductor tracks, two of these tracks being intended for the supply of the assembly of resistors and the third track arranged externally of the two other tracks being intended for a polarization voltage.

By this embodiment, an improvement of the results with respect to the samples treated by plasma is obtained due to the fact that they can now be polarized.

In an embodiment, this device is characterized in that a refractory metallic disk is arranged at the surface of the upper face of the crown, this disk then forming the carrying surface for the sample. This disk can advantageously be made of molybdenum.

the metallic disk then permits further minimizing the temperature gradients in the sample. If the metallic disk consists of molybdenum, it supports the high temperatures without oxidized and without being degasing during operation in a high vacuum.

In an embodiment, the device is characterized in that the conductor tracks are concentric crowns. These tracks can be rigid and electrically insulated from each other and from the frame by means of crowns of refractory insulating material; on the other hand, the frame support comprises electrical supply pads in a number at least equal to the number of tracks of the frame, arranged such that each pad comes into contact with one of the tracks of this frame.

In this embodiment, the heating element arranged in the frame is electrically supplied when this frame is simply placed on the frame support.

In an embodiment, the frame support is a platform rotating about a shaft integral with the device.

The fact that the frame support is rotating in the device permits arranging several sample carriers in this device in such a manner that all samples are treated homogeneously due to the rotation.

In a further preferred embodiment, the supply of the pads of the rotating platform is effected by friction of rotating electrical tracks integral with the rotating platform and of electrical fixed tracks integral with the device, these tracks being electrically insulated from each other and from their respective supports and the tracks of the rotating platform being electrically conected to the respective pads of the rotating platform, these tracks moreover being present in a number at least equal to the number of the tracks of the frame.

In this manner, the electrical supply of the rotating platform can readily be effected. Besides, if the heating resistors are of the type applied by silk-screen printing, the electrical supply is effected at a low voltage of, for example, 30 V and not at 220 V, as with the known device.

In order that the invention may be readily carried out, it will now be described more fully, by way of example, with reference to the accompanying drawing.

BRIEF DESCRIPTION OF THE DRAWING

FIGS. 2a to 2c show the frame and the different elements of the sample carrier, which are enclosed in the frame according to the invention.

DESCRIPTION OF THE PREFERRED ENBODIMENT

Figure 1:
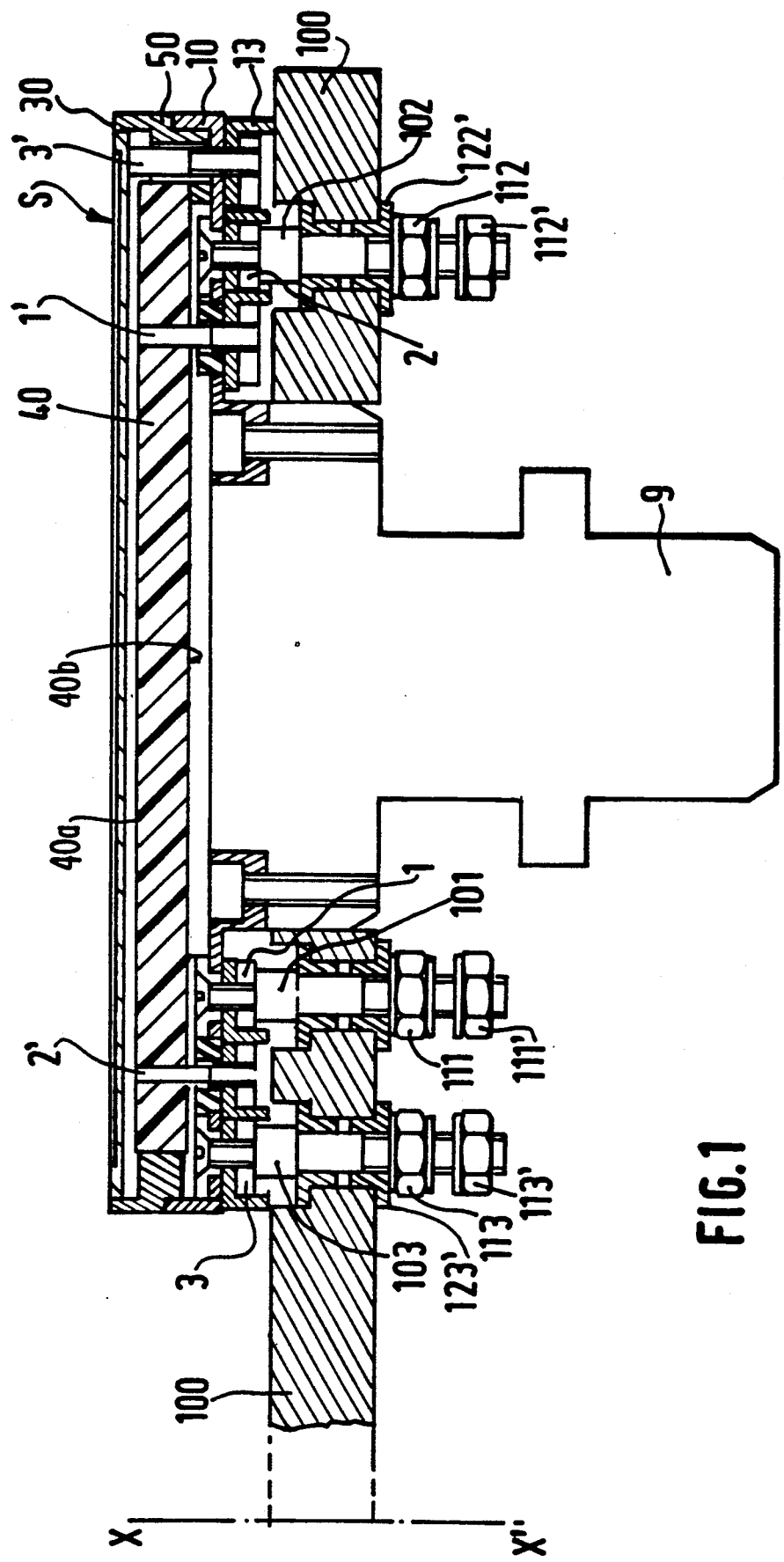
FIG. 1 shows an assembly comprising a frame support and a sample carrier according to the invention.

As shown in FIG. 1, the sample carrier according to the invention comprises a frame support 100, a frame 10 provided with a centering axis 9, an insulating crown 50, a heating element 40, a sample carrier 30 and the sample S itself. This sample carrier moreover comprises supply pads 101, 102, 103 integral with the frame support 100 and supply tracks 1, 2 and 3 integral with the frame 10. Moreover, in order to connect the heating element 40, supply pins 1', 2', 3' integral with the conductor tracks 1, 2 and 3, respectively, enter metallized holes of the heating element 40.

Figure 2A:
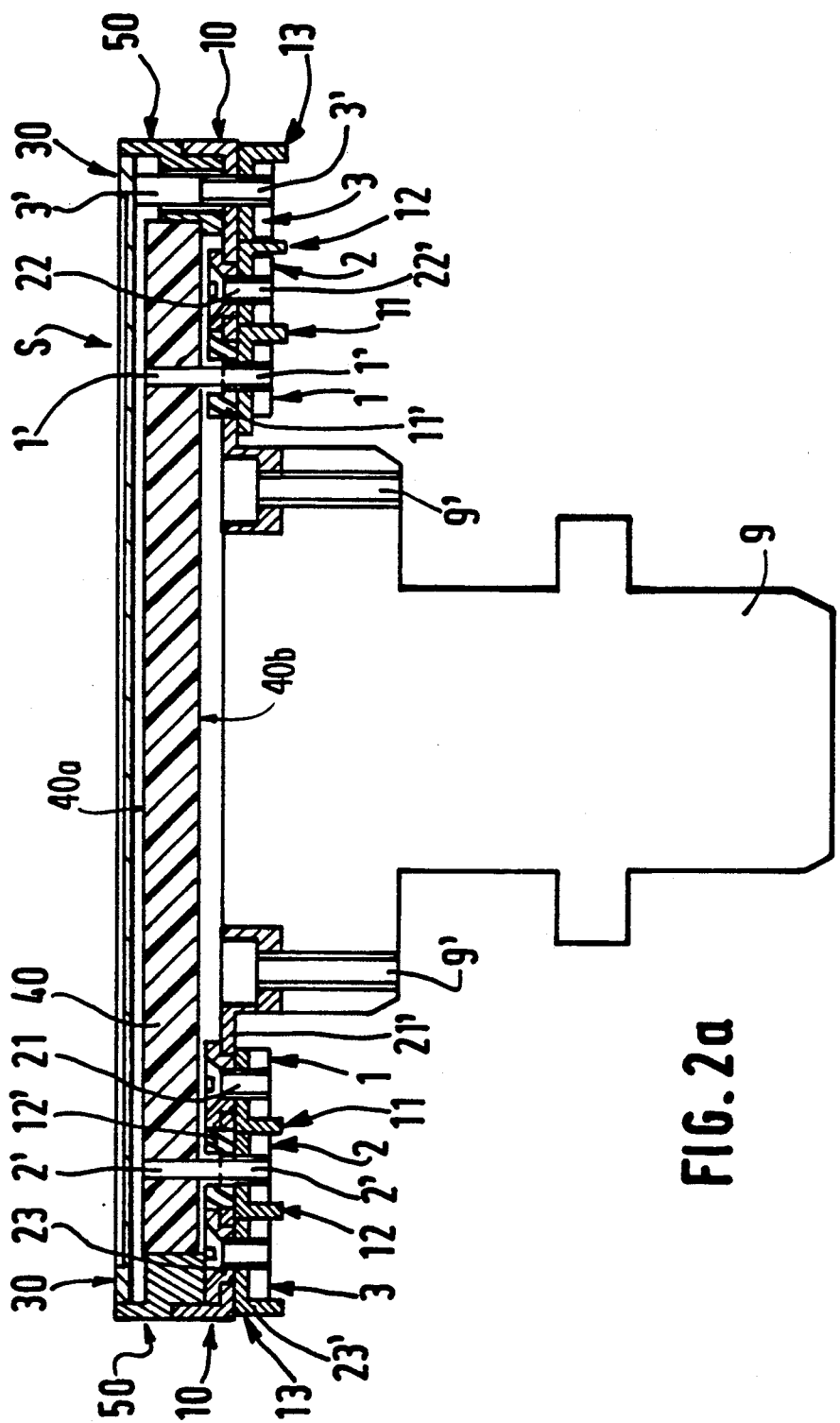
Figure 2B:
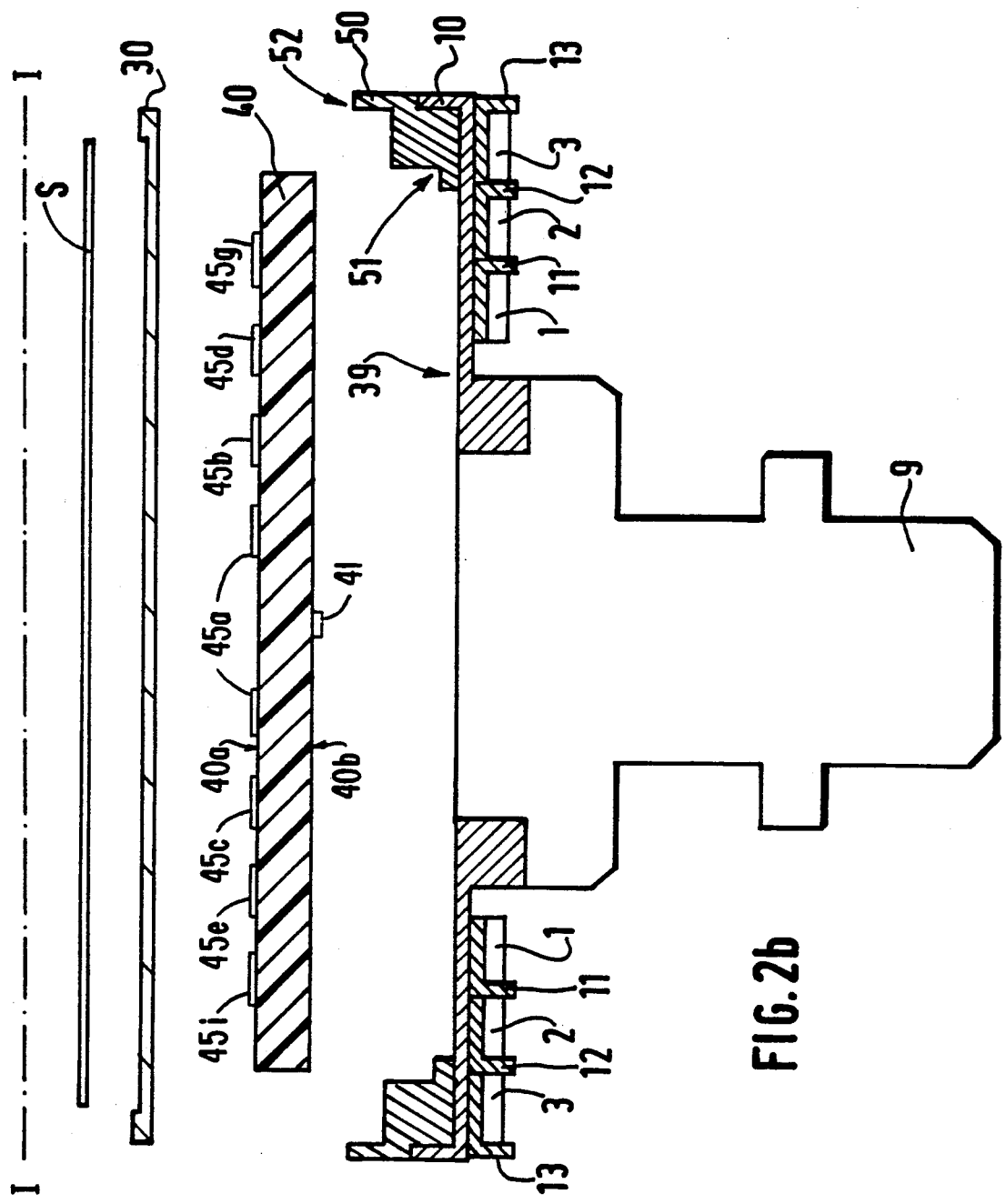

As shown in FIG. 2b, the frame 10 of the sample carrier according to the invention is a disk having a circular recess 39 in its upper part. This recess is adapted to receive first a crown 50 of an insulating refractory material, for example alumina or any other ceramic material. This circular crown 50 is favourably provided with a shoulder 51 adapted to receive the heating element 40.

The heating element 40 is favourably a disk of an insulating refractory material. According to the invention, as insulating refractory material, a glass ceramic material is preferably chosen, which has the advantage that it has a very small linear expansion coefficient as a function of the temperature.

Instead of the shoulder 51 provided in the crown 50, a disk of an insulating refractory material may also be arranged under the heating disk 40 to thermally insulate the disk 40 from the metallic frame 10.

The upper surface 52 of the insulating crown 50 represents the carrying surface for the sample S. It is provided in order that this sample is arranged at a small distance above the heating disk 40. However, in order to minimize the temperature gradients on the substrate S, it is favourable to interpose a metallic plate 30, which will bear on the surface 52 of the crown 50 and which then constitutes the carrying surface for the sample.

Figure 4A:
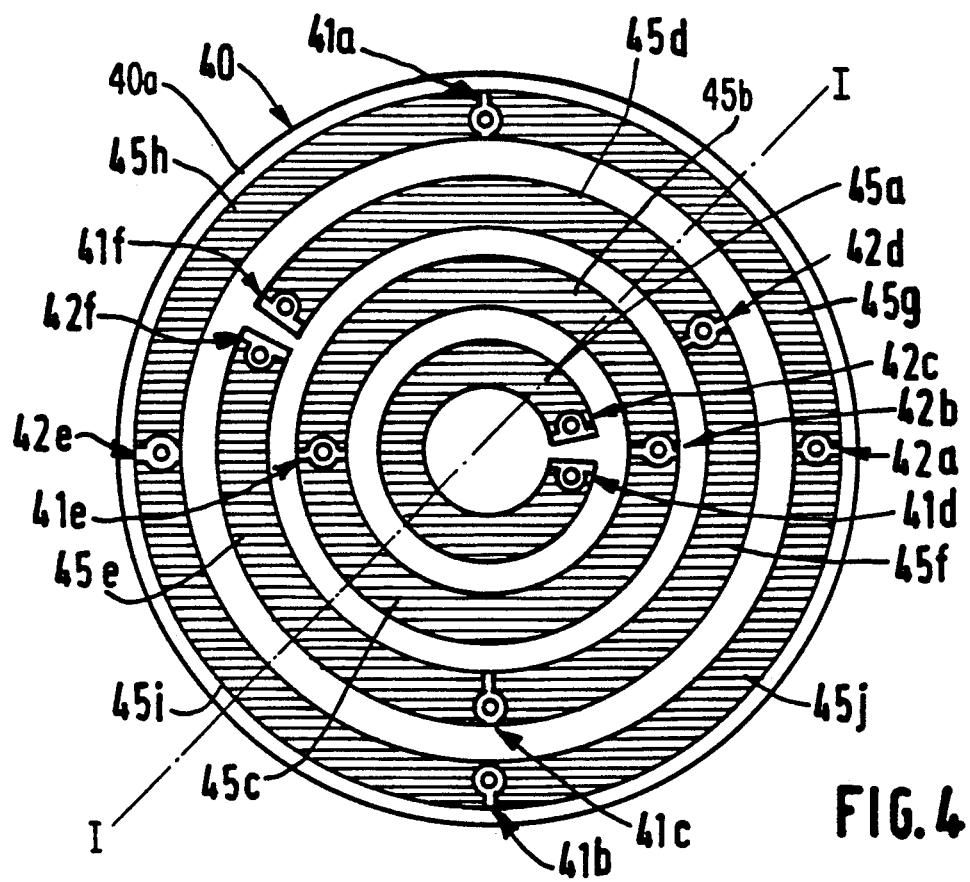
FIGS. 4a and 4b show the circuit of resistors and the circuit for supplying the resistors according to the invention.
Figure 4B:
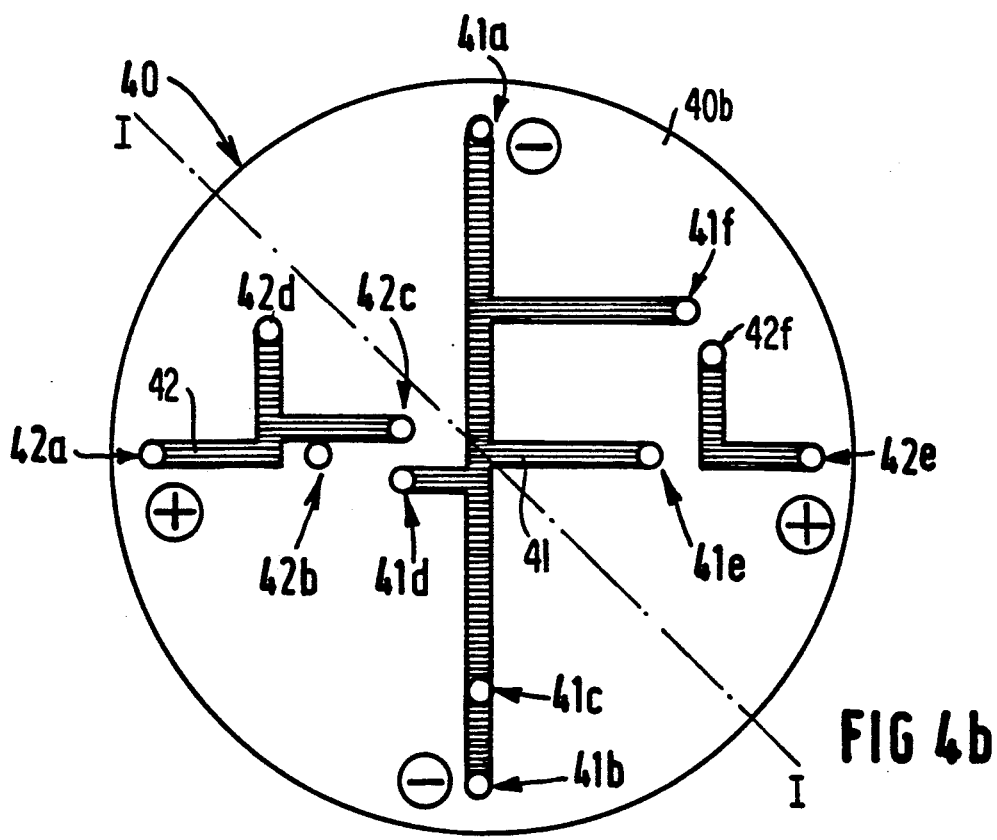

As shown in FIG. 4a, the heating disk 40 comprises at its upper surface and assembly of heating resistors 45a to 45j all arranged in parallel. These heating resistors are realized in accordance with the invention by means of layers applied by silk-screen printing, as described in European Patent Application No. 88202637.0. In order to obtain this assembly of resistors, therefore a first insulating layer and then a resistive layer for forming the body of the resistors and a conductive layer for forming the ends of the resistors are therefore deposited on the surface of the disk 40. In coincidence with the ends of the resistors, holes are provided in the heating disk 40. These holes are metallized by means of the same material as that which serves to form the ends of the resistors, as shown in FIG. 4b. The lower surface of the heating disk 40 carries a circuit of conductive lines. This circuit is provided to interconnect the ends of the resistors intended to be connected to a positive terminal of a supply source and to interconnect the ends of the resistors intended to be connected to a negative terminal of an electrical supply source. The design of the assembly of resistors shown in FIG. 4a and the design of the connection circuit shown in FIG. 4b are given only by way of example to obtain a heating element, over which the electrical resistors are distributed homogeneously permitting of thus minimizing the temperature gradients at the surface.

Especially by means of a heating element as described above, whose resistors and supply circuit are shown in FIG. 4, it has been possible to obtain for the sample temperatures of the order of 550° C. ±10° C. The silk-screen printing process used to form the heating resistors is a process that can be carried out very easily, is inexpensive and permits of obtaining designs arranged in configurations suitable to cover the whole surface of the heating disk 40. Moreover, this circuit requires only a small electrical supply voltage.

The metallized holes 41 and 42 have two functions. On the one hand, they ensure the connection between the ends of the resistors arranged at the upper surface of the disk 40 and the connection circuit arranged on the lower surface of the disk 40, and on the other hand they permit of connecting the assembly of resistors to the terminals of a supply source because they permit of introducing pins carried by the frame.

As shown in FIG. 2c, the frame 10 comprises on its lower surface an assembly of conductor tracks 1, 2 and 3, which are in this case rigid circular tracks of an electrically non-conducting material. These tracks 1, 2 and 3 can be fixed to the frame 10 by means of screws 21, 22, 23, this arrangement being insulated from the frame 10 by means of insulating beads 21', 22' and 23'. Metallic pins 1', 2' and 3' are also fixed to these conductor tracks, 1, 2, 3 and these pins traverse the frame 10 through insulating beads 11', 12', 13'. The design according to which the pins 1', 2' and 3' traverse the frame 10 is also provided in order that these pins coincide with metallized holes 41 for the pins 1' and 42 for the pins 2'. The pins 3' are made loonger so as to traverse the insulating crown 50 and to permit the contact on the sample carrier 30. By this contact, a polarization voltage of the sample can be applied to the sample carrier 30 and this voltage can be particularly effective in the case in which the sample carrier according to the invention is intended to be used in a plasma reactor.

With the design proposed in FIG. 4, for the assembly of resistors and its supply circuit it is not necessary to provide more than four pins, the first being connected to the track 1 to connect the circuit to a first supply terminal, two pins being connected to the track 2 to connect the circuit to a second supply terminal and the fourth pin being connected to the track 3 to polarize, as the case may be, the sample.

FIG. 2a shows the frame of the sample carrier thus equipped. The frame can be made of any arbitrary metal and more favourably of a metal which is not degased and is not oxidized, such as stainless steel. The frame 10 also comprises a centering shaft 9, which can be fixed to the frame 10, for example by screws 9'. This shaft 9 can be made of a metal other than that of the frame 10, for example a heavy metal, such as tungsten, in order to give the frame a certain weight, which will then permit perfect electrical contact of the tracks 1, 2 and 3 on the supply pads 101, 102, 103 of the frame support 100. The shaft 9 can also favourably comprise a shoulder 8 which permits of gripping the frame by means of a fork so that its displacement can be readily effected when the frame is introduced into a framework or when it should be extracted therefrom.

Figure 3:
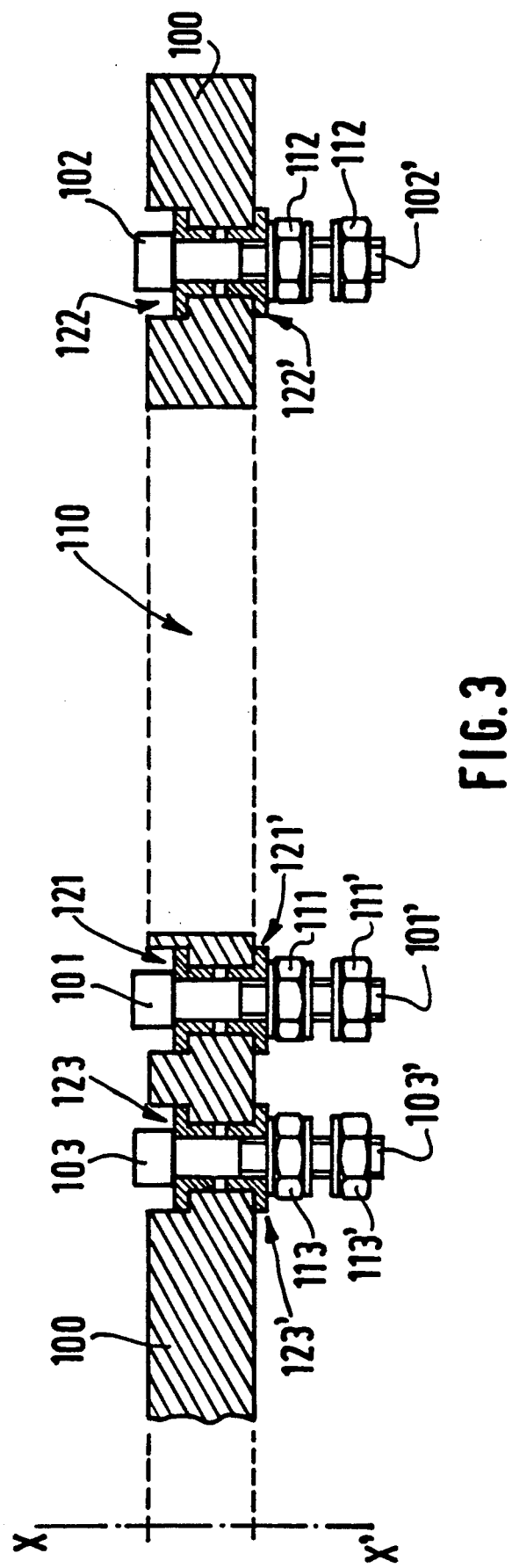
FIG. 3 shows the frame support.

As shown in FIG. 3, the frame support 100 can favourably be a platform rotating about an axis XX'. This platform has an opening 110, through which the shaft 9 of the frame 10 is introduced. This platform also comprises metallic pads 101, 102, 103 constituted, for example, by the metallic screw heads traversing the plate 100 and insulated from said plate by insulating beads 121, 121', 122, 122', 123, 123' for the pads 101, 102 and 103, respectively. These pads can thus be fixed to the platform 100 by means of nuts 111, 112 and 113, respectively. In order to apply the current to the pads 101, 102, 103, electrical conductors can be fixed by the nuts 111', 112', 113'.

In order that the opening 110 permits of accurately centering the frame 10 on the platform 100, the shaft 9 of the frame can first be introduced into a hole of the platform forming a prolongation of the opening 110 and then be slipped into said hole as far as the centre of the opening 110.

The heating sample carrier according to the invention is intended to be introduced into a device, such as a vacuum chamber, a plasma reactor etc. . . . In order to supply the pads 101, 102, 103 of the rotating platform by means of the conductors connected to the nuts 111', 112', 113', metallic circular tracks can be provided in the device or framework and these tracks will come into frictional contact with metallic also circular tracks integral with the platform when the platform will rotate. The metallic tracks integral with the framework are provided in a number sufficient to supply tracks integral with the rotating platform also in a number sufficient to be connected to the pads of the platform 100. The rotating tracks integral with the platform 100 and the nuts 111', 112', 113' can be connected by means of flexible wires. The insulating materials to obtain especially the insulating beads of the device according to the invention can be any ceramic material, while the rotating platform can consist of stainless steel. The sample carrier 30 will favourably consist of molybdenum, which withstands high temperatures without being degased.

We claim:

1. A device including a heating sample carrier, which comprises a carrying surface, an electrical heating system, and a frame support adapted to receive a frame,
characterized in that the electrical heating system comprises a disk of a refractory insulating material, whose upper surface is provided with an assembly of electrical resistors,
the lower surface of the frame carrying conductor tracks insulated from each other and from the frame to form an electrical supply system of the assembly of resistors, the upper surface of the frame support comprising electrical supply pads of a number at least equal to the number of tracks in the frame, said pads being arranged according to a design whereby each pad comes into contact with one of the tracks of the frame, and the frame and frame support being separate elements and not integral with each other, and the frame and frame support fitting together.

2. A device as claimed in claim 1, characterized in that the assembly of electrical resistors is formed by resistive layers for the bodies of the resistors and conducting layers for the ends of the resistors.

3. A device as claimed in claim 2, characterized in that the refractory disk is moreover provided with metallized holes arranged so as to coincide with the ends of the resistors.

4. A device as claimed in claim 3, characterized in that the lower surface of the refractory disk is moreover provided with a circuit of conducting lines arranged according to a design suitable to connect the assembly of resistors in parallel and in that this circuit is connected to the assembly of resistors by metallization of the holes.

5. A device as claimed in claim 4, characterized in that the circuit of conducting lines and the metallizations of the holes are formed by by silk-screen printing.

6. A device as claimed in claim 3, characterized in that the electrical connection between the tracks and the circuit of the resistors is formed by means of at least one metallic pin per track traversing the thickness of the frame of the center of insulating beads, these pins being arranged according to a design suitable to coincide with the metallized holes of the refractory disk and having a diameter suitable to enter these metallized holes whilst supplying the electrical contact aimed at.

7. A device as claimed in any one of claim 6, characterized in that the conductor tracks are concentric crowns.

8. A device as claimed in claim 7, characterized in that the tracks are rigid and electrically insulated by means of crowns of insulating refractory material.

9. A device as claimed in claim 6, characterized in that the frame carries three conductors tracks, two of these tracks being utilized for the supply of the assembly of resistors and the third track arranged externally of the two other tracks being utilized at a polarisation voltage.

10. A device as claimed in claim 6, characterized in that a metallic refractory disk is arranged at the surface of the upper face of the refractory crown, this disk then forming the carrying surface for the sample, and the connection between the third track and the metallic disk is established by means of at least one metallic pin traversing the frame at the center of an insulating bead and traversing the refractory crown, this pin having a length suitable to establish the contact with the metallic disk.

11. A device as claimed in claim 1, characterized in that the material for forming the refractory disk is a glass ceramic material.

12. A device as claimed in claim 11, characterized in that the assembly of resistors is formed on the upper surface of the refractory disk by means of a first insulating layer, of a second conducting layer and of a third resistive layer.

13. A device as claimed in claim 1, characterized in that the frame is a metallic disk, whose upper surface comprises a recess adapted to receive the refractory disk.

14. A device as claimed in claim 1, characterized in that the insulating refractory elements outside the disk carrying the heating resistors consist of ceramic material.

15. A device as claimed in claim 14, characterized in that the ceramic material is alumina.

16. A device as claimed in claim 15, characterized in that the shaft of the frame is provided with a shoulder so that it can be gripped by a fork.

17. A device as claimed in claim 16, characterized in that the frame support is provided with a hole communicating with the centering opening so as to introduce the shaft of the frame by means of a fork before centering it in the centering opening.

18. A device as claimed in claim 1, characterized in that the carrying surface of the sample carrier is formed by the upper surface of a crown of an insulating and refractory material carried by the upper surface of the frame, the height of this crown being such that this carrying surface is located at a small distance from the surface of the resistors of the refractory disk.

19. A device as claimed in claim 18, characterized in that an electrically insulating and refractory disk is arranged in the bottom of the recess of the frame between the refractory disk and the frame, and the crown is arranged in the recess of the frame so as to enclose the said refractory disk and, as the case may be, the insulating disk.

20. A device as claimed in claim 19, characterized in that the crown has the form of an L, the upper part of the L having a diameter slightly exceeding that of the refractory disk and provided, as the case may be, with a shoulder for supporting it, while the lower part of the L has a diameter slightly exceeding that of the insulating disk when it exists, the thickness of the L being moreover provided so that the crown has an outer diameter slightly smaller than that of the recess of the upper surface of the frame.

21. A device as claimed in claim 18, characterized in that a metallic refractory disk is arranged at the surface of the upper face of the refractory crown, this disk then forming the carrying surface for the sample.

22. A device as claimed in claim 21, characterized in that the disk consists of molybdenum.

23. A device as claimed in claim 1, characterized in that the lower surface of the frame comprises a centering shaft having a dimension suitable to be enclosed in an opening of the frame support.

24. A device as claimed in claim 23, characterized in that the frame support is a platform rotating about a shaft integral with the device.

25. A device as claimed in claim 24, characterized in that the supply of the pads of the rotating platform is effected by friction between rotating electrical tracks integral with the rotating platform and fixed electrical tracks integral with the device, these tracks being insulated from each other and from their respective supports and the tracks of the rotating platform being connected electrically to the respective pads of the rotating platform, these tracks being moreover present in a number at least equal to the number of the tracks of the frame.

26. A device as claimed in claim 1, characterized in that the layers for forming the assembly of electrical resistors are of the type applied by silk-screen printing.

* * * * *